(12) United States Patent
Takei et al.

(10) Patent No.: US 7,648,906 B2
(45) Date of Patent: Jan. 19, 2010

(54) METHOD AND APPARATUS FOR PROCESSING A CONDUCTIVE THIN FILM

(75) Inventors: Koji Takei, Nagano (JP); Sumihiro Ichikawa, Nagano (JP); Yasunari Suzuki, Nagano (JP); Ryo Fukasawa, Nagano (JP); Daisuke Matono, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 435 days.

(21) Appl. No.: 11/330,520

(22) Filed: Jan. 11, 2006

(65) Prior Publication Data

US 2006/0160340 A1 Jul. 20, 2006

(30) Foreign Application Priority Data

Jan. 18, 2005 (JP) ............................... 2005-010072
Nov. 4, 2005 (JP) ............................... 2005-320856

(51) Int. Cl.
*H01L 21/4763* (2006.01)
*H01L 21/20* (2006.01)
*H01L 21/00* (2006.01)

(52) U.S. Cl. ...................... 438/622; 438/584; 438/59; 438/80

(58) Field of Classification Search ................ 438/584, 438/622, 425, 426, 424, 59, 80
See application file for complete search history.

(56) References Cited

U.S. PATENT DOCUMENTS 5,090,121 A * 2/1992 Gaddis ........................ 29/847
6,319,747 B1 11/2001 Todisco et al. ................. 438/94
6,924,427 B2 * 8/2005 Eckert et al. ................. 136/252

FOREIGN PATENT DOCUMENTS

| DE | 197 15 048 A1 | 10/1998 |
|---|---|---|
| EP | 0 476 856 A1 | 3/1992 |
| JP | 07-130701 | 5/1995 |
| JP | 2000-114555 | 4/2000 |
| JP | 2001-119048 | 4/2001 |
| JP | 2001-210851 | 8/2001 |

OTHER PUBLICATIONS

English Abstract for DE 197 15 048 A1, Oct. 22, 1998.
European Search Report for corresponding EP 06 25 0026, dated Apr. 5, 2006.

* cited by examiner

*Primary Examiner*—Chuong A. Luu
(74) *Attorney, Agent, or Firm*—Locke Lord Bissell & Liddell LLP (57) ABSTRACT

A method and apparatus for processing a thin film able to easily form grooves in a conductive thin film on an insulating substrate, comprising bringing a first electrode into contact with the conductive thin film, maintaining a conductive state between a tip of a second electrode with a voltage applied with respect to the first electrode and the surface of the conductive thin film, and using the tip of the second electrode to scan the conductive thin film so as to thereby form grooves passing through the thickness of the conductive thin film and exposing the surface of the insulating substrate at their bottoms in the conductive thin film.

13 Claims, 9 Drawing Sheets

Fig.12B  APPLY RESIST

Fig.12C  PATTERN RESIST

Fig.12D  ETCH

Fig.12E  REMOVE RESIST

METHOD AND APPARATUS FOR PROCESSING A CONDUCTIVE THIN FILM

BACKGROUND OF THE INVENTION

1. Field of the Invention

The present invention relates to a method and apparatus for processing a conductive thin film formed on the surface of an insulating substrate, more particularly relates to a method and apparatus for processing a molybdenum or other metal thin film used as the bottom electrode of a thin film solar cell or an indium tin or other transparent conductive thin film used as a top electrode. The transparent conductive thin film of the present invention can be utilized as an electrode of a light-receiving surface of a solar cell and also a transparent electrode of a liquid crystal display panel, plasma display panel, organic electroluminescence device, or other various types of display devices or as a heat generating element of a defroster.

2. Description of the Related Art

Thin film solar cells include a typical types ones having a basic structure of a back surface glass substrate/molybdenum thin film or other bottom electrode/CIS (Cu—In—S, Cu—In—Se) or other semiconductor thin film/ITO (indium tin oxide) or other transparent conductive oxide (TCO) thin film top electrode and ones having a basic structure of a light incident side glass substrate/ITO (indium tin oxide) or other transparent conductive oxide (TCO) thin film top electrode/amorphous silicon semiconductor thin film/metal bottom electrode. In each type, generally a structure comprised of a large number of unit cells arranged planarly in parallel on a glass substrate and having adjoining cells connected in series has been employed.

To fabricate this array, a processing step of patterning the molybdenum thin film (bottom electrode) or TCO thin film (top electrode) formed as a continuous film on a glass substrate to divide it corresponding to the unit cells is necessary. Similar patterning of unit cells is also performed on the semiconductor thin films formed on these electrode thin films etc. There has therefore been room for improvement in the patterning of these electrode thin films.

Figure 11:
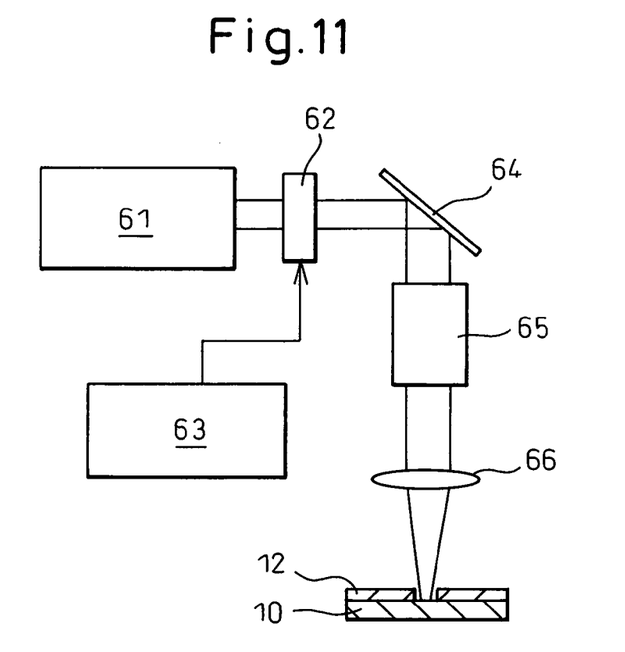
Fig. 11 shows a laser patterning method of a transparent conductive film of the related art.
Figure 12A:
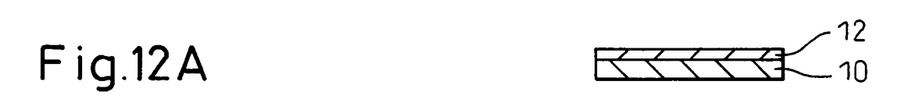
Fig. 12A to Fig. 12E show a patterning method by etching a transparent conductive film of the related art.
Figure 12B:
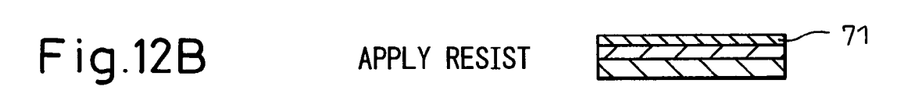
Figure 12C:
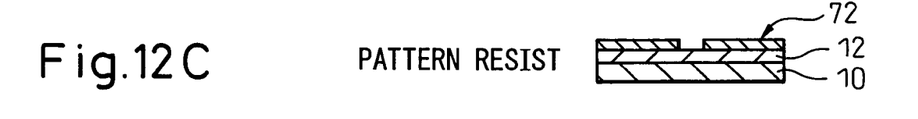
Figure 12D:
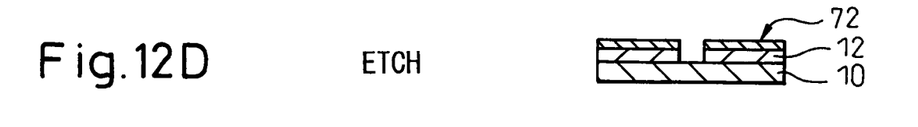
Figure 12E:
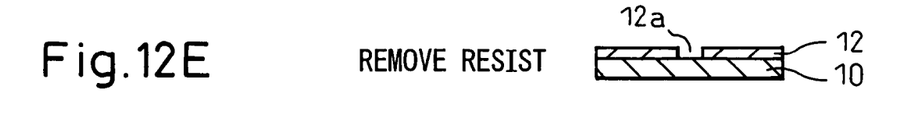

As the conventional methods of patterning a transparent conductive film, the laser patterning method and the etching method have been the most general. The laser patterning method, as shown in Fig. 11, focuses a high output laser beam on a transparent conductive film 12 to locally heat it and thereby vaporize or peel off and remove the transparent conductive film 12 at the parts irradiated by the laser to obtain the desired shape. Note that in Fig. 11, reference numeral 10 indicates a substrate, 12 indicates a transparent conductive film, 61 indicates a high output laser oscillator, 62 indicates an attenuator, 63 indicates a controller, 64 indicates a mirror, 65 indicates a beam forming optical system, and 66 indicates a condensing lens.

The laser patterning method enables high speed patterning with a smaller number of steps, so is being used for patterning solar cells and other objects requiring processing over a large area at a high speed. However, there have been the problems that when the conditions for focusing the laser beam are not suitable, the glass or plastic substrate 10 ends up being damaged, the laser oscillator 61 is expensive, tremendous labor is required for maintenance and management for maintaining the performance of the equipment, etc.

The etching method, as shown in Figs. 12A to 12E, coats a transparent conductive film 12 on a substrate 10 (Fig. 12A) with a photoresist 71 (Fig. 12B), patterns this photoresist film 71 to form the targeted mask 72 on the transparent conductive film 12 (Fig. 12C), removes only the parts exposed from the mask 72 of the transparent conductive film 12 by wet etching or dry etching (Fig. 12D), then removes the resist 71 (72) (Fig. 12E) to obtain a transparent conductive film 12 having the targeted shapes of pattern grooves 12a.

In this etching method, a step for processing the mask other than processing the transparent conductive film 12 itself and a step for removing the mask are necessary. The overall number of steps increase, so there was the problem that the product costs rose.

The prior known publications disclose the following. Japanese Patent Publication (A) No. 2001-210851 discloses patterning a molybdenum, ITO, or other electrode thin film by a laser beam. According to this, as explained above, there were the problems that a laser oscillator is expensive and tremendous labor is required for maintenance and management for maintaining the performance of the equipment.

The inventors tried to solve the problem of patterning by a laser beam by the so-called "lift-off method" of forming patterns on a substrate in advance by a photoresist, depositing an electrode thin film from above, then peeling off the photoresist patterns and the parts of the electrode thin film on them, but found the problem that the increase in the number of steps led to an increase in the production costs.

Further, Japanese Patent Publication (A) No. 2001-119048 discloses to use the mechanical scribe method to pattern an electrode thin film. The inventors tried this, but found the problem that since the molybdenum thin film forming the electrode thin film is high in hardness, patterning is difficult.

As other known publications, Japanese Patent Publication (A) No. 2000-114555 discloses to use ZnO as a transparent conductive film, pattern this by laser scribing, then chemically etch this. Further, Japanese Patent Publication (A) No. 7-130701 discloses to pattern a transparent conductive film by wet etching using as a mask a resist pattern with edges tapered by adjusting the amount of exposure and amount of development at the time of photolithography or using different masks for a plurality of etchings to form step shapes and thereby form a gentle slant at the pattern edges.

SUMMARY OF THE INVENTION

An object of the present invention is to provide a method and apparatus for processing a conductive thin film able to solve the problems in the related art and easily form pattern grooves in the conductive thin film on the insulating substrate.

To achieve this object, according to a first aspect of the present invention, there is provided a method of processing a conductive thin film formed on the surface of an insulating substrate, comprising bringing a first electrode into contact with the conductive thin film, maintaining a conductive state between a tip of a second electrode with a voltage applied with respect to the first electrode and the surface of the conductive thin film, and using the tip of the second electrode to scan the conductive thin film so as to thereby form grooves passing through the thickness of the conductive thin film and exposing the surface of the insulating substrate at their bottoms in the conductive thin film.

According to a second aspect of the invention, there is provided a method of processing a conductive thin film comprising applying a predetermined voltage between a first electrode contacting part of a conductive thin film formed on the surface of an insulating substrate by a sufficient area and a second electrode with a tip processed to dimensions of the same extent as the width of the pattern grooves to be formed and in that state using the tip of the second electrode to scan the conductive thin film so as to form pattern grooves passing through the thickness of the conductive thin film and exposing the surface of the insulating substrate as their bottoms in the conductive thin film.

Further, according to the present invention, there is provided a processing apparatus for forming pattern grooves in a conductive thin film formed on the surface of an insulating substrate, provided with a means for fastening and fixing the insulating substrate on a table by a first electrode brought into contact with the conductive thin film, a second electrode having a width corresponding to the groove width of the patterns which the scanning part of the tip should form, a means for applying voltage between the first electrode and the tip of the second electrode, and a drive and control means for maintaining a conductive state between the surface of the conductive thin film and the tip of the second electrode and moving the second electrode or the table so as to form pattern grooves passing through the thickness of the conductive thin film and exposing the surface of the insulating substrate at their bottoms in the conductive thin film.

According to the method and apparatus for processing a conductive thin film of the present invention, if maintaining a conductive state between the tip of the second electrode and the surface of the conductive thin film, at the conductive parts of the conductive thin film, the current concentrating at the fine areas generates Joule's heat whereby the current-carrying parts of the conductive thin film are vaporized or oxidized and thereby removed by etching. At this time, the insulating substrate below the conductive thin film does not carry current, so functions as an etching stopper. Therefore, at the current carrying parts, the entire thickness of the conductive thin film is removed, the surface of the insulating substrate is exposed, and depressions are formed with the surface of the insulating substrate as their bottoms.

If maintaining this conductive state and using the tip of the second electrode to scan the conductive thin film, the depressions formed by the etching form continuous grooves along the scan path. These grooves pass through the entire thickness of the conductive thin film. The surface of the insulating substrate exposed in the grooves forms the bottoms of the grooves.

As a result, the conductive thin film is divided by these grooves as scribe lines, so by scanning by a predetermined pattern, the conductive thin film is patterned.

The method of the present invention is advantageous in the following points compared with the above prior art.

(1) The method can be realized by a usual power supply and electrodes, so no expensive facility is required such as with laser beam processing and the maintenance is also easy.

(2) Patterning is possible by just using the tip of the second electrode to scan the surface of the conductive thin film, so no complicated steps are required such as with the lift-off method and there is no increase in cost due to the same.

(3) Since the conductive thin film is vaporized or oxidized and thereby removed by etching, patterning is easy without regard to the hardness of the conductive thin film like with the mechanical scribe method.

(4) If providing a plurality of second electrodes and their power supplies, a single operation enables a plurality of patterns to be simultaneously formed, so the patterning speed can be easily improved.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENT

Figure 1A:
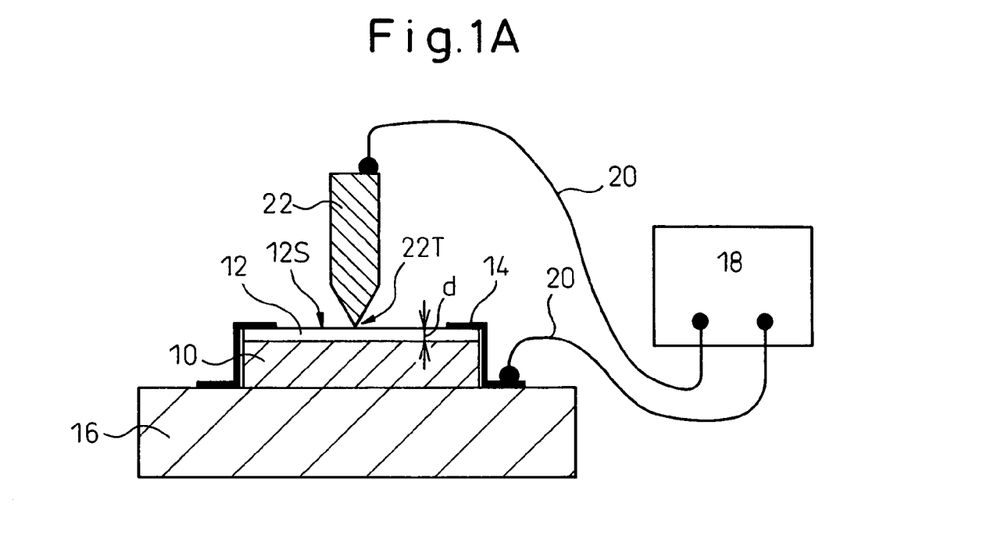
Fig. 1A and Fig. 1B are a cross-sectional view and perspective view showing the hardware conFiguration for working the method of the present invention.
Figure 1B:
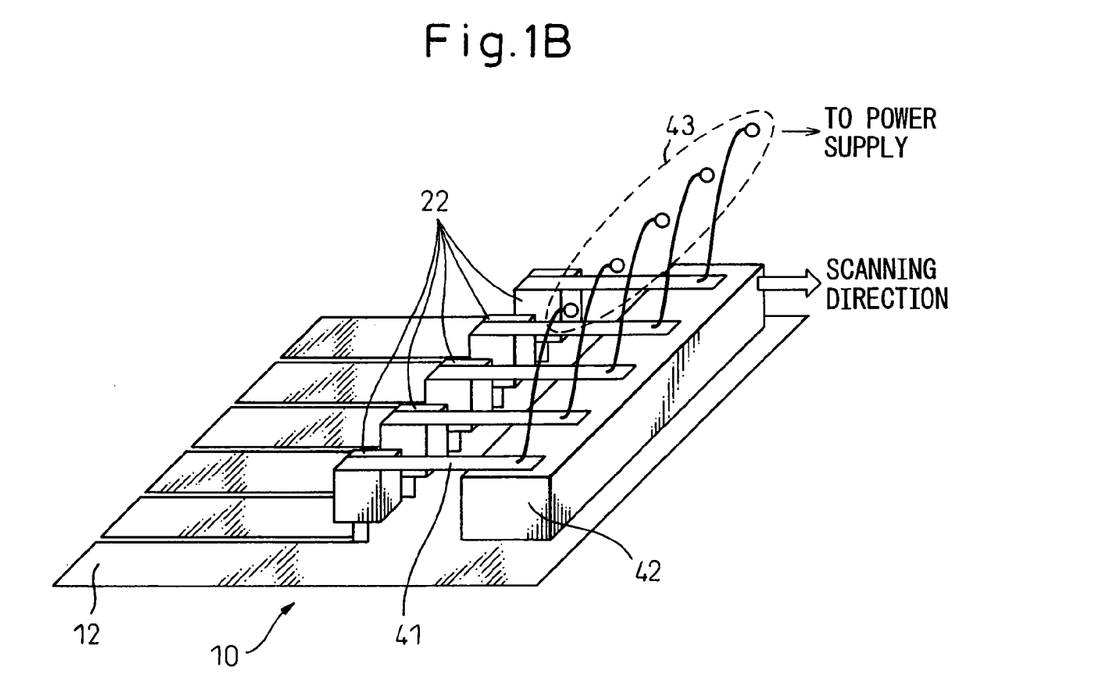
Figure 2A:
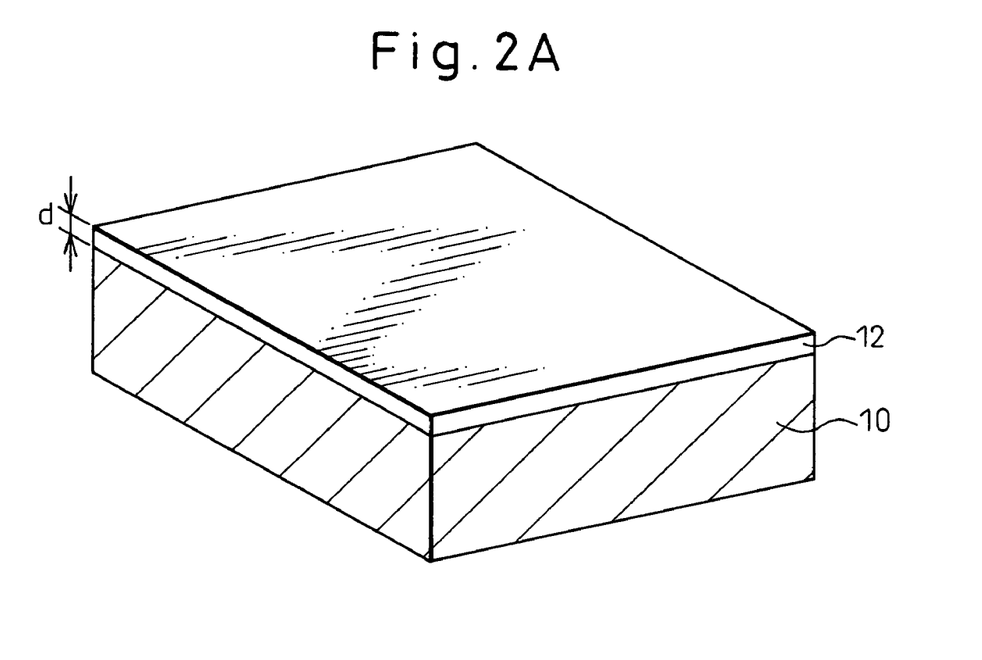
Fig. 2A and Fig. 2B are perspective views of the processed object (A) and the state after processing (B) according to the present invention.
Figure 2B:
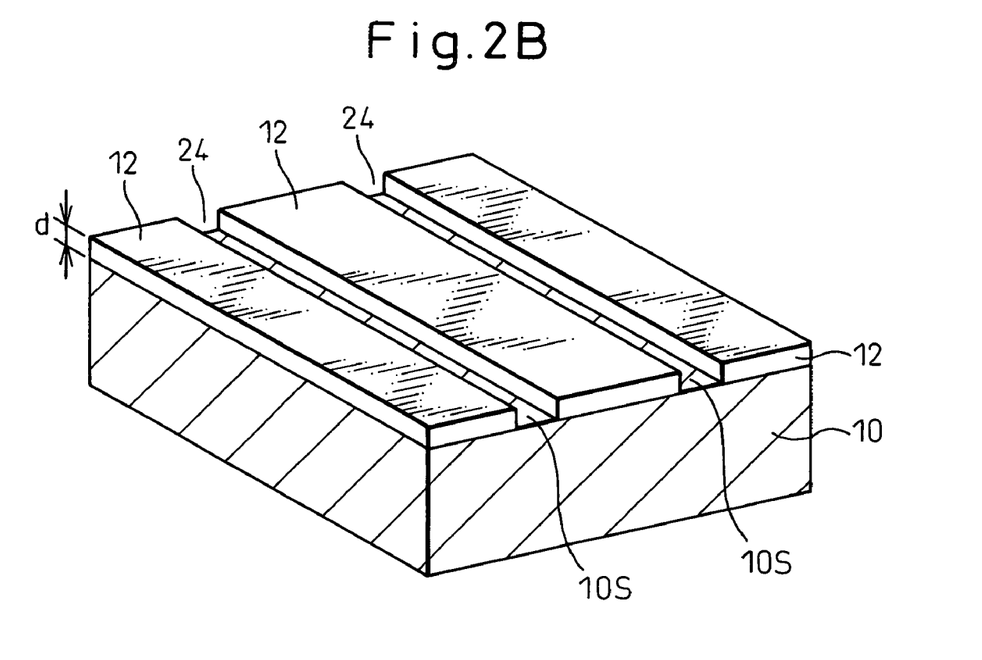

Referring to Fig. 1 and Fig. 2, a basic embodiment of the method processing a conductive thin film according to the present invention will be explained.

As shown in Figs. 1A, 1B, and 2A, an insulating substrate 10 comprised of a glass substrate is formed on its surface with a conductive thin film (transparent conductive film) 12. A first electrode 14 brought into contact with the conductive thin film 12 fastens and fixes the insulating substrate 10 on a table 16. However, it is also possible provide a fastening jig separate from the first electrode 14 and use the first electrode 14 only for supplying power. While maintaining a conductive state between the tip 22T of the second electrode 22 supplying voltage from a power supply 18 through a lead wire 20 to the first electrode 14 and the surface 12S of the conductive thin film 12, the tip 22T of the second electrode 22 is used to scan the conductive thin film 12. This scanning is performed by making at least one of the second electrode 22 and table 16 move relative to the other.

Due to this, as shown in Fig. 2B, grooves 24 passing through the thickness d of the conductive thin film 12 and exposing the surface 10S of the insulating substrate 10 at their bottoms are formed in the conductive thin film 12.

As the material of the second electrode 22, copper (Cu), brass (Cu—Zn alloy), Al or Al alloy, or tungsten (W) may be used. Copper is most superior in terms of conductivity. Brass is good in workability, so is suitable for making various shapes of second electrodes. When the processed object, that is, the conductive thin film 12, is soft, it is also possible to use Al or Al alloy. When the processed object, that is, the conductive thin film 12, is hard, if a hard material like tungsten is used, the wear of the second electrode can be reduced.

As the power supply 18, a direct current (DC), alternating current (AC), pulse current, or other various types of power may be used.

Figure 3:
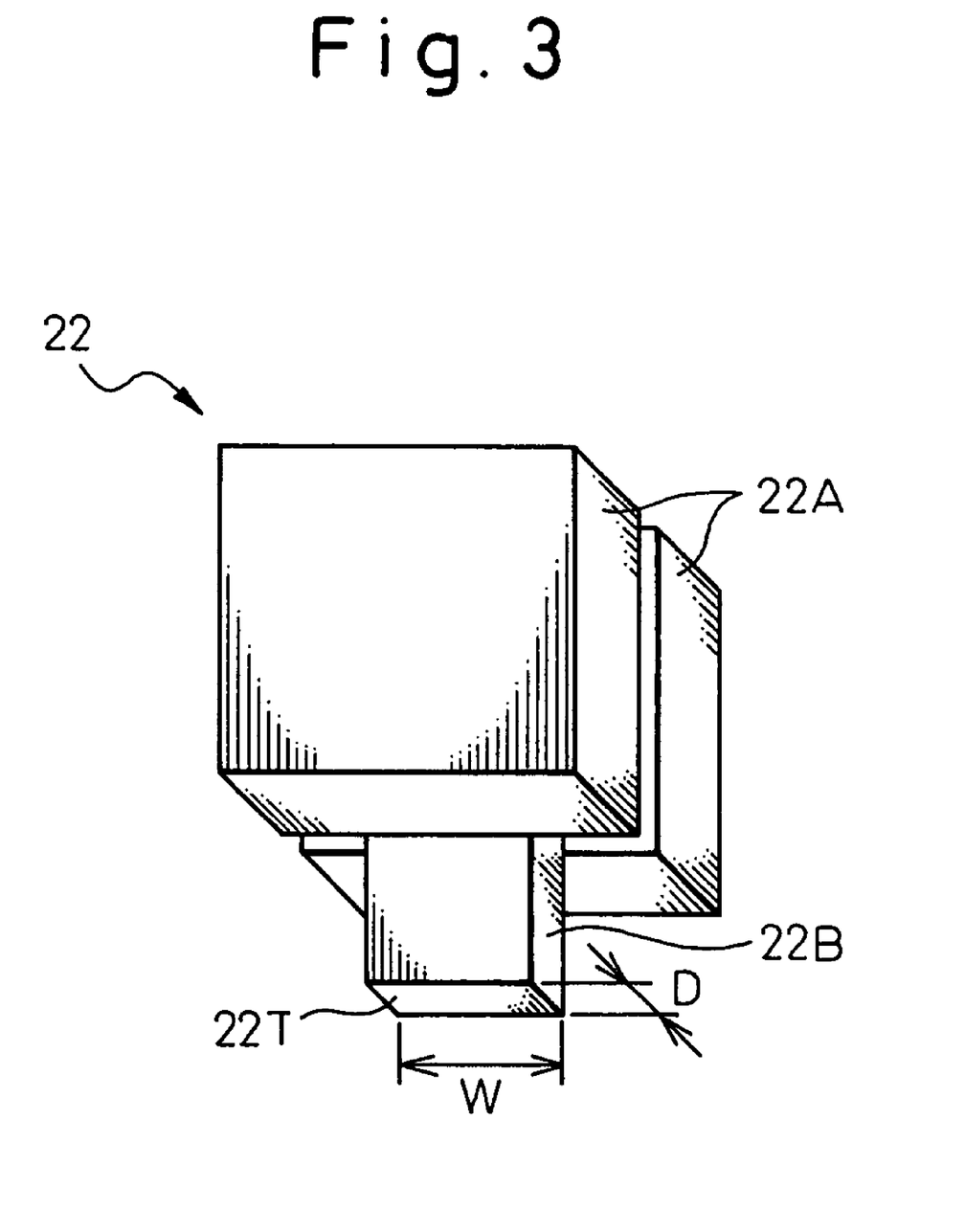
Fig. 3 is a perspective view showing a preferred embodiment of a second electrode used in the method of the present invention.

The second electrode 22 may be shaped with the tip 22T tapered as shown in Fig. 1A, but the shape shown in Fig. 3 is also preferable.

That is, the second electrode 22 shown in Fig. 3 is of a form comprised of a pair of electrode holders 22A sandwiching an electrode body 22B. The electrode body 22B is of a strip shape having a certain width W and thickness D. Note that D is a dimension of the same extent as the width of the grooves 24. Due to this, even if wear of the electrode body 22B accompanying use causes the tip 22T to retract in position, the tip 22T is constantly maintained at a fixed area. As a result, throughout the entire processing process, the conductive parts of the conductive thin film 12 are maintained at constant areas and high stability processing can be realized.

Fig. 1B shows a processing method (processing apparatus) for a plurality of second electrodes 22 by a perspective view. For example, five second electrodes 22 arranged in parallel are supported by a second electrode support table 42 comprised of an insulating material via a plate spring 41 or other spring. Each second electrode 22 is connected to a power supply using a power supply terminal 43.

If arranging n number (for example, five) second electrodes 22 in this way, the processing speed becomes n times (for example, five times) faster. Therefore, it is possible to make n number of patterns with a single scan.

Figure 4:
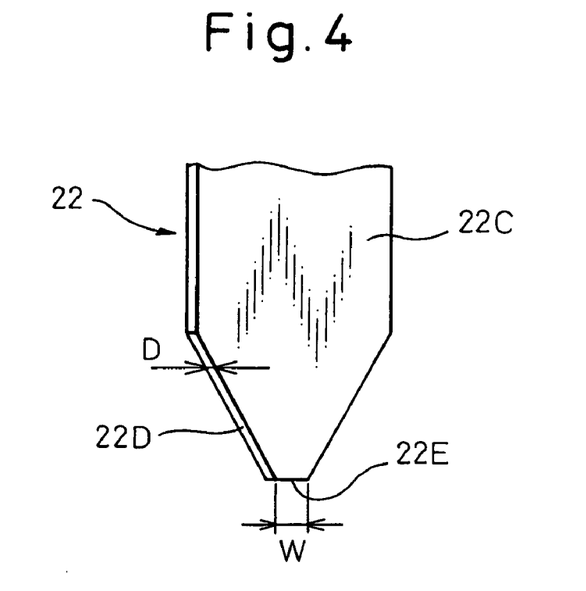
Fig. 4 is a perspective view showing another embodiment of the second electrode used in the present invention.
Figure 5:
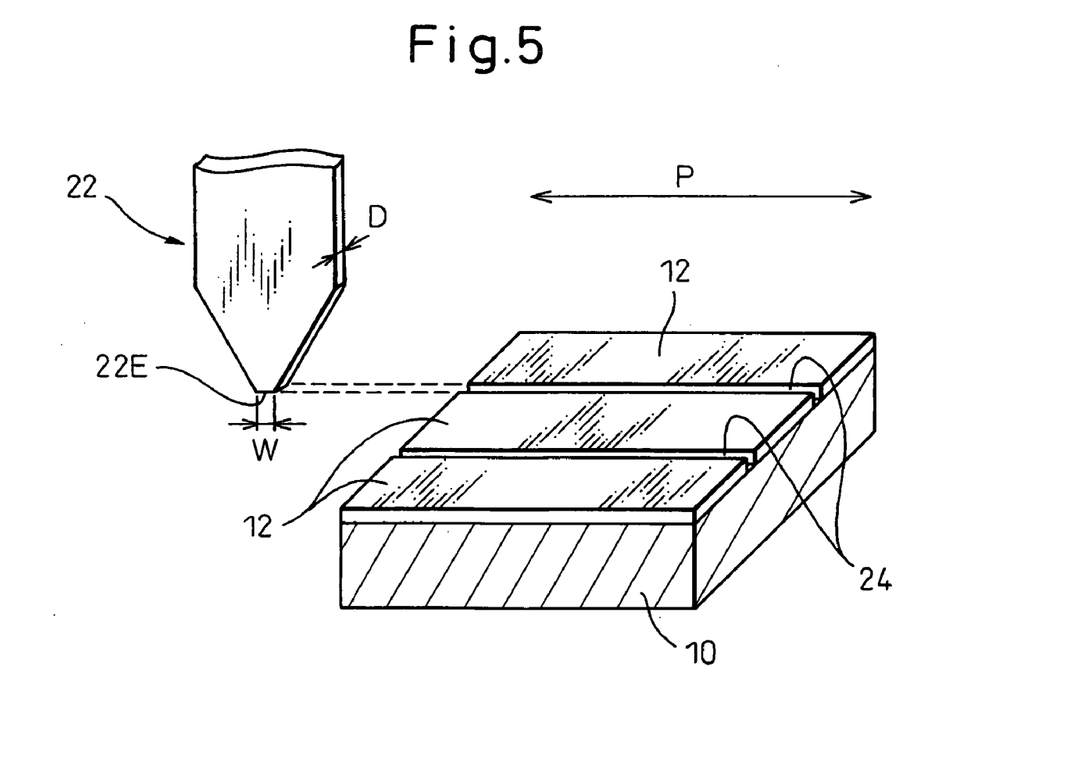
Fig. 5 is a perspective view showing the state of using the second electrode shown in Fig. 4 to sweep the transparent conductive film on the substrate.

Fig. 4 shows another preferable embodiment of the second electrode 22. The electrode body part 22C of the second electrode is comprised as an electrode plate comprised of a copper or other metal sheet having a thickness D of about the same dimensions (for example, D=100 μm) as the width of the pattern grooves to be formed. Further, the tip 22D of the electrode plate 22C is tapered so that it becomes smaller in width the further to the tip in the longitudinal direction (relative direction of progression or sweep direction of second electrode and conductive thin film 12 at time of scanning). The contact surface 22E with the conductive thin film 12 is made short in width (for example, W=1 mm). Therefore, at the time of scanning, as shown in Fig. 5, the second electrode 22 scans the conductive thin film 12 in the sweep direction shown by the arrow P by a contact surface of a thickness D×width W, whereby grooves (patterns) 24 with a width corresponding to the thickness D of the contact surface 22E of the tip of the second electrode 22 are formed in the conductive thin film 12.

EXAMPLE 1

Figure 6:
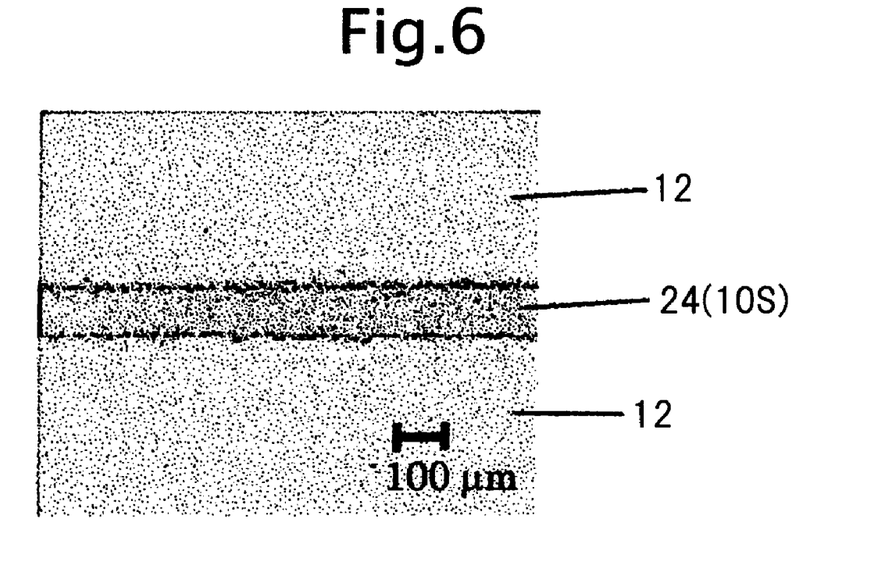
Fig. 6 is a photograph of the surface of a sample formed with grooves according to Example 1 of the present invention.

The method of the present invention was used to process an Mo thin film formed as a conductive thin film 12 on the surface of a glass substrate forming the insulating substrate 10. This Mo thin film is a conductive thin film for forming a bottom electrode for a thin film solar cell by sputtering, evaporation, etc. The processing conditions were as follows. Note that the second electrode 22 shown in Fig. 3 was used.
 Processing Conditions
  Second electrode (electrode body): thickness D=0.1 mm, width W=5 mm copper sheet
  Power supply unit: Metronics Model 526
  Voltage and limit current value: 5V and 0.2 A
  Second electrode sweep speed: 2 cm/sec As shown in Fig. 6, this processing forms grooves 24 of widths of 100 μm in the Mo thin film 12. The bottoms of the grooves 24 are comprised of the exposed surface 10S of the insulating substrate 10.

EXAMPLE 2

The method of the present invention was used to process an Mo thin film, for forming the bottom electrode of a thin film solar cell, as a conductive thin film 12 formed on the surface of a glass substrate forming the insulating substrate 10. The processing conditions were similar to Example 1 other than the thickness D=0.2 mm of the second electrode.

This processing forms grooves 24 of a width of 200 μm in this Mo thin film 12. The bottoms of the grooves 24 are comprised of the exposed surface 10S of the insulating substrate 10.

In the above embodiment, a single second electrode 22 was used, but if simultaneously forming a plurality of grooves, it is possible to greatly improve the efficiency of patterning.

EXAMPLE 3

As the second electrode 22, one comprised of an electrode plate (electrode body part) 22C as shown in Fig. 4 was shown. As shown in Fig. 5, the second electrode 22 was used to sweep the glass substrate (insulating substrate) 10 in the arrow P direction to process it. As the conductive thin film 12 formed on the surface of the glass substrate 10, a general fluorine-doped tin oxide (FTO) thin film was used. The dimensions (specifications) and patterning conditions of the transparent conductive film substrate including this conductive thin film 12 were as follows.
 Specifications of Transparent Conductive Film Substrate
  Product name: $SnO_2$ conductive substrate (made by Asahi Glass)
  Substrate size: 50 mm×50 mm×1.1 mm$^t$
  Substrate material: Glass
  Transparent conductive film material: Fluorine-doped tin oxide (FTO)
  Transparent conductive film thickness: 1.0 μm
  Transparent conductive film sheet resistance: 8.8Ω/□
 Patterning Conditions
  Power supply (DC stabilized power supply): MODEL 526 (made by Metronics)
  Voltage setting (limit current value): 20V (2A)
  Second electrode sweep speed: 2 cm/sec Here, the suitable supplied voltage should be selected mainly in accordance with the value of the sheet resistance of the processed object, that is, the transparent conductive film 12. When the value of the sheet resistance is high, a higher supplied voltage tends to be required. A large Joule's heat is generated at the contact surface 22E at the tip of the second electrode 22 contacting the transparent conductive film 12. The transparent conductive film 12 at the contacting parts evaporates or peels off. As a result, pattern grooves 24 are formed along the sweep path of the second electrode 22.

Figure 7A:
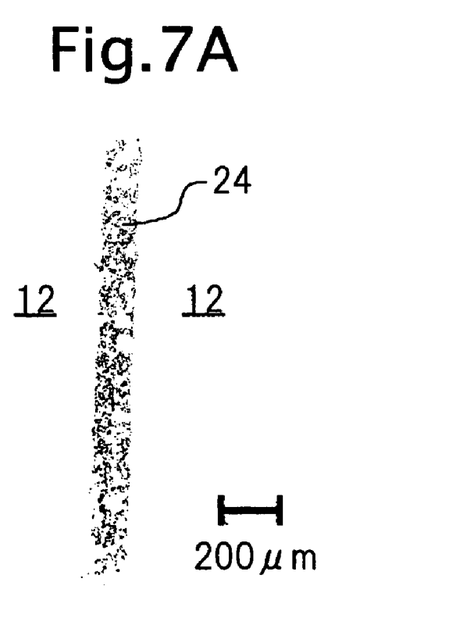
Fig. 7A and Fig. 7B shows the state (A) of the pattern grooves in Example 3 compared with the case of applying an excessive voltage (B)
Figure 7B:
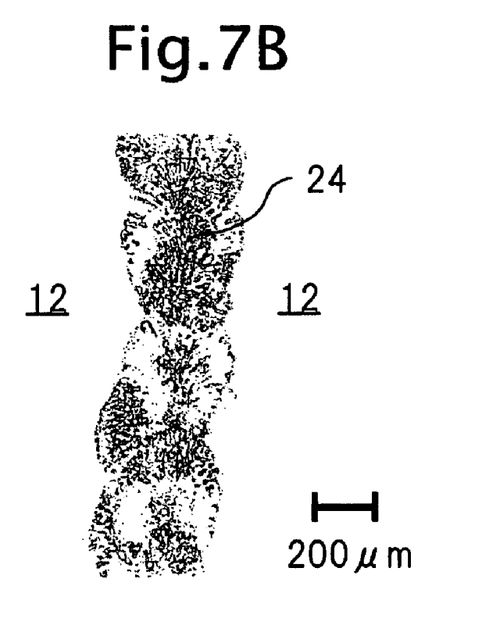

Fig. 7A shows the state of forming the processed pattern grooves of the transparent conductive film 12 in the case of processing under the suitable conditions. In this case, it is learned that pattern grooves of substantially the same line width as the thickness D (100 μm) of the second electrode 22 are formed. As opposed to this, Fig. 7B shows an example the same in other conditions in Example 3, but with the supplied voltage made an excessive voltage (80V). It is learned that the width of the pattern grooves becomes much greater than the thickness D (100 μm) of the second electrode 22.

Next, under the conditions of Example 3, four straight pattern grooves were formed on a 50 mm square substrate at intervals of 10 mm to divide the transparent conductive film 12 into five. The five parts of the transparent conductive film were successively designated as 1 to 5 (measurement locations). The values of the electrical resistances between the adjoining parts of the transparent conductive film (values of the electrical resistances between patterns) were measured. As a result, the following was obtained.

| Value of Electrical Resistance Between Patterns | |
| --- | --- |
| Measurement location | Resistance value |
| 1-2 | 38 kΩ |
| 2-3 | 40 kΩ |
| 3-4 | 44 kΩ |
| 4-5 | 50 kΩ |
| | (Average) 43 kΩ |

When using such a divided transparent conductive film to form a device, leakage current flows through the transparent conductive film, but in a device like a solar cell where the output voltage per cell is a low one of about 0.5V to 0.8V and the current is large (up to 20 mA/cm$^2$), the value of the electrical resistance between the adjoining parts of the transparent conductive film is, as explained above, a sufficiently high one of several 10 kΩ and the leakage current is at most several 10 μA, so the characteristics of the solar cell are not lowered. However when operating like with a display device with a high voltage and a low current, the insulation between parts of the divided transparent conductive film has to be further improved.

EXAMPLE 4

Figure 8:
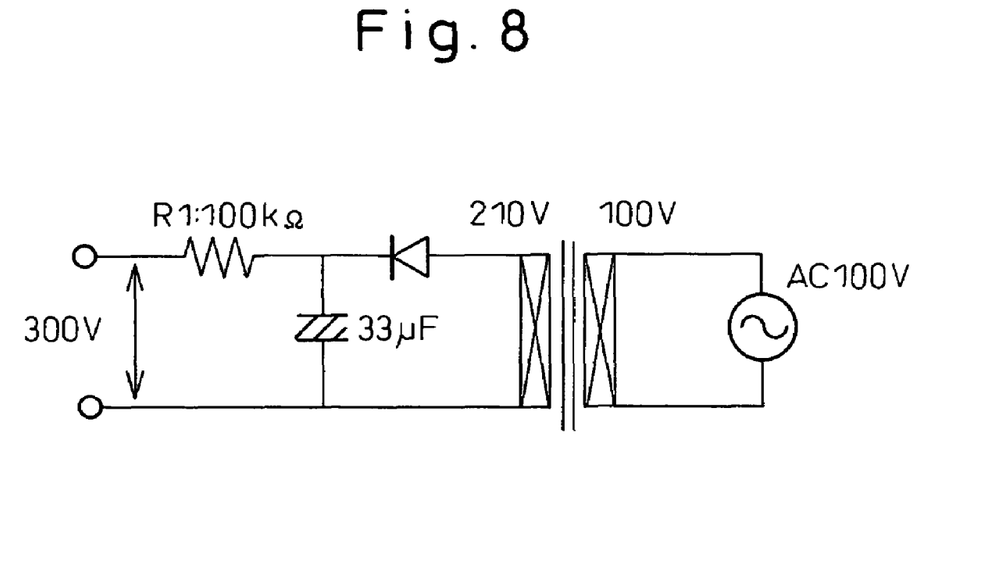
Fig. 8 is a circuit diagram of the power supply unit used in Example 4.

When using a divided transparent conductive film to form a device, to improve the insulation between the parts of the transparent conductive film, the same method as in Example 3 is used to divide the transparent conductive film, then a high voltage is supplied between adjoining parts of the transparent conductive film. An example of such a high voltage power supply circuit is shown in Fig. 8. Therefore, by building in a high voltage power supply circuit shown in Fig. 8 to the power supply shown by reference numeral 18 in Fig. 1A, it is possible to generate a voltage of 300V, but the current limiting resistor R1 keeps the output current value down to a maximum of 3 mA. Due to this, it is possible to prevent damage to the film due to the flow of an overcurrent giving rise to an arc discharge between the adjoining parts of the transparent conductive film supplied with voltage.

Figure 9A:
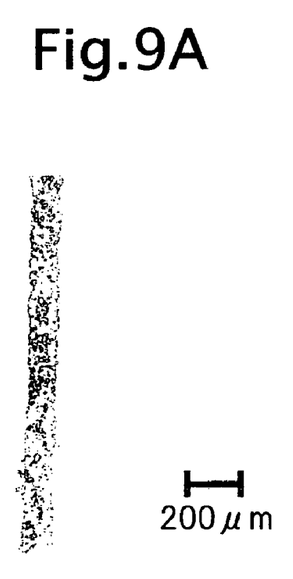
Fig. 9A and Fig. 9B compare the state of the pattern grooves in Example 4 comparing the case of limiting the current (A) and the case of not limiting the current (B)
Figure 9B:
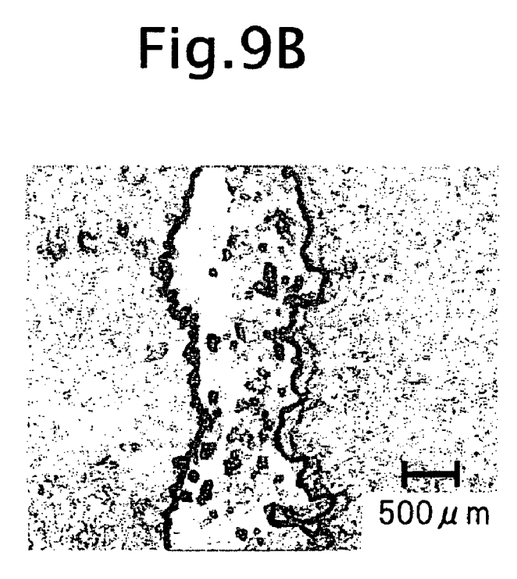

Figs. 9A and 9B show the differences in processing patterns due to the presence or absence of a current limiting resistor. When there is no current limiting resistor R1, as shown in Fig. 9B, it is learned that the overcurrent causes the transparent conductive film to be damaged over a broad range. As opposed to this, when using a current limiting resistor R1, as shown in Fig. 9A, the transparent conductive film is not damaged and substantially the predetermined groove widths (100 μm) are maintained.

A high voltage was applied between divided parts of the transparent conductive film using the power supply unit shown in Fig. 8. After this, the values of the resistances between parts of the transparent conductive film were measured. The values of the resistances were 1 MΩ or more at 1-2, 2-3, 3-4, and 4-5. This is because due to the application of a high voltage, a resistor of several 10 s of kΩ present between the parts of the transparent conductive film is burned out and the insulation between parts of the transparent conductive film is greatly improved.

EXAMPLE 5

Figure 10:
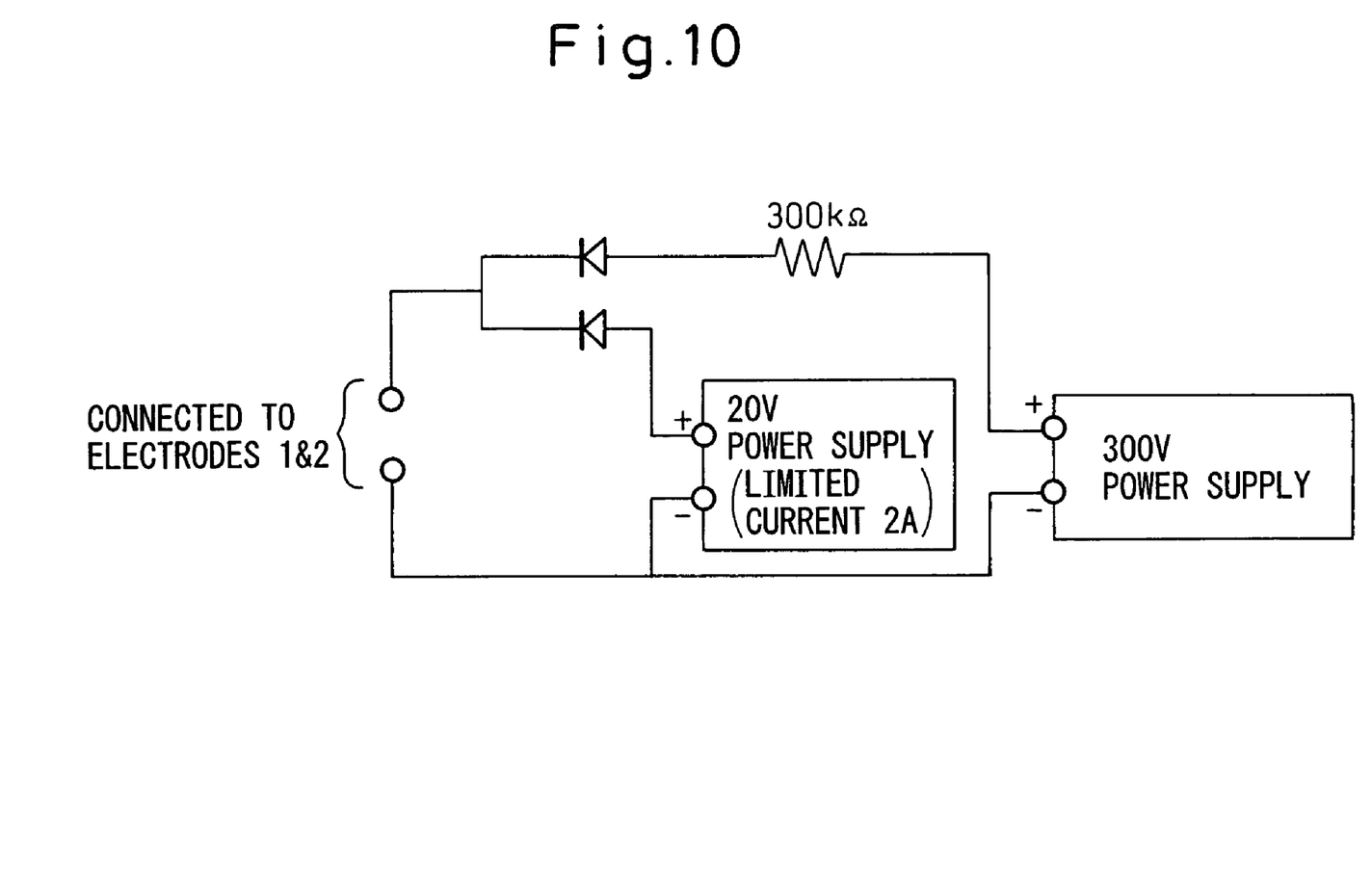
Fig. 10 is a circuit diagram of a power supply unit used in Example 5.

To improve the insulation of the parts of the transparent conductive film, a power supply characterized by having different limit current values for different magnitudes of the supplied voltage is used to pattern the transparent conductive film. An example of the power supply unit is shown in Fig. 10. By conFiguring the power supply unit in this way, if using the second electrode to sweep the transparent conductive film in contact, even if a low voltage power supply (20V power supply) acts, groove patterns are formed in the transparent conductive film in the same way as Example 3. At this time, even if there is a high resistance resistor in the groove pattern region, by the continued action of the high voltage power supply (300V), the high resistance resistor is burned out and the insulation is improved by the parts of the transparent conductive film divided by the groove pattern. Further, since the current limiting resistor (300 kΩ) kept the maximum current down to 1 mA or less, the wear does not reach any other region of the transparent conductive film.

In Example 5, four straight patterns of a width of 100 μm were formed on a 50 mm square substrate at intervals of 10 mm to divide the transparent conductive film into five. The values of the electrical resistances between the adjoining parts of the transparent conductive film were measured. As a result, the values of the resistances were 1 MΩ or more, that is, good insulation was obtained, in all of 1-2, 2-3, 3-4, and 4-5.

By sweeping with the second electrode just once, good insulation can be secured between adjoining parts of the transparent conductive film. If using the power supply unit in this embodiment, it becomes possible to pattern with a high insulation by a short routine even if using post processing for supplying a high voltage.

As explained above, the voltage of the high power supply voltage (second voltage) is 5 to 50 times or so the voltage used for the patterning. Further, the limit current value of the power supply of the high power supply voltage (second voltage) is $\frac{1}{1000}$ to $\frac{1}{10000}$ or so times the limit current value of the voltage used for the patterning.

According to the present invention, there are provided a method and apparatus for processing a thin film enabling grooves to be easily made in a conductive thin film on a insulating substrate.

The method of the present invention (1) can be realized by a usual power supply and electrodes, so no expensive facility is required such as with laser beam processing and the maintenance is also easy, (2) patterning is possible by just using the tip of the second electrode to scan the surface of the conductive thin film, so no complicated steps are required such as with the lift-off method and there is no increase in cost due to the same, (3) since the conductive thin film is vaporized or oxidized and thereby removed by etching, patterning is easy without regard to the hardness of the conductive thin film like with the mechanical scribe method, and (4) if providing a plurality of second electrodes and their power supplies, a single operation enables a plurality of patterns to be simultaneously formed, so the patterning speed can be easily improved.

While the invention has been described with reference to specific embodiments chosen for purpose of illustration, it should be apparent that numerous modifications could be made thereto by those skilled in the art without departing from the basic concept and scope of the invention.

The invention claimed is:

1. A method of processing a conductive thin film formed on the surface of an insulating substrate, comprising:
   bringing a first electrode into contact with said conductive thin film;
   maintaining a conductive state between a tip of a second electrode with a voltage applied with respect to said first electrode and the surface of said conductive thin film;
   using the tip of said second electrode to scan said conductive thin film so as to thereby form grooves passing through the thickness of said conductive thin film and exposing the surface of said insulating substrate at their bottoms in said conductive thin film;
   applying a predetermined voltage between said first electrode contacting part of said conductive thin film and said second electrode with a tip processed to dimensions of the same extent as the width of the pattern grooves to be formed and in that state using the tip of said second electrode to scan said conductive thin film so as to form pattern grooves passing through the thickness of said conductive thin film and exposing the surface of said insulating substrate at their bottoms in said conductive thin film;
   applying a second voltage much larger than the predetermined voltage between said first electrode and said second electrode thereby improving insulation between adjoining parts of said conductive thin film separated by said pattern grooves and setting a limit current value of a power supply of said second voltage to a much lower value compared with the limit current value of the power supply used for the patterning; and
   making the limit current value of the power supply used for the patterning differ in accordance with the magnitude of the supplied voltage.

2. A method of processing a conductive thin film as set forth in claim 1, further comprising using as said insulating substrate a glass substrate having, formed on its surface as said conductive thin film, a metal thin film for forming a bottom electrode of a thin film solar cell.

3. A method of processing a conductive thin film as set forth in claim 2, further comprising using as said metal thin film a molybdenum thin film.

4. A method of processing a conductive thin film as set forth in claim 1, further comprising using as said insulating substrate a glass substrate having, formed on its surface as said conductive thin film, a transparent conductive thin film for forming a top electrode of a thin film solar cell.

5. A method of processing as set forth in claim 4, further comprising using as said transparent conductive thin film an indium tin oxide thin film.

6. A method of processing a conductive thin film as set forth in claim 1, further comprising simultaneously scanning a plurality of said second electrodes to simultaneously form a plurality of said grooves.

7. A method of processing a conductive thin film comprising:
   applying a predetermined voltage between a first electrode contacting part of a conductive thin film formed on the surface of an insulating substrate and a second electrode with a tip processed to dimensions of the same extent as the width of the pattern grooves to be formed and in that state using the tip of said second electrode to scan said conductive thin film so as to form pattern grooves passing through the thickness of said conductive thin film and exposing the surface of said insulating substrate at their bottoms in the conductive thin film; and
   applying a second voltage much larger than said predetermined voltage between said first electrode and said second electrode thereby improving insulation between adjoining parts of said conductive thin film separated by said pattern grooves and setting a limit current value of a power supply of said second voltage to a much lower value compared with the limit current value of the power supply used for the patterning.

8. A method of processing a conductive thin film as set forth in claim 7, further comprising making the limit current value of the power supply used for the patterning differ in accordance with the magnitude of the supplied voltage.

9. A method of processing a conductive thin film as set forth in claim 2, further comprising simultaneously scanning a plurality of said second electrodes to simultaneously form a plurality of said grooves.

10. A method of processing a conductive thin film as set forth in claim 3, further comprising simultaneously scanning a plurality of said second electrodes to simultaneously form a plurality of said grooves.

11. A method of processing a conductive thin film as set forth in claim 4, further comprising simultaneously scanning a plurality of said second electrodes to simultaneously form a plurality of said grooves.

12. A method of processing a conductive thin film as set forth in claim 5, further comprising simultaneously scanning a plurality of said second electrodes to simultaneously form a plurality of said grooves.

13. A method of processing a conductive thin film as set forth in claim 7, further comprising making the limit current value of the power supply used for the patterning differ in accordance with the magnitude of the supplied voltage.

* * * * *